United States Patent [19]
Cai et al.

[11] Patent Number: 5,267,272
[45] Date of Patent: Nov. 30, 1993

[54] RECEIVER AUTOMATIC GAIN CONTROL (AGC)

[75] Inventors: Khiem V. Cai, Brea; James L. Thomas, Placentia; Patrick L. Lim, Hacienda Heights, all of Calif.

[73] Assignee: Hughes Aircraft Company, Los Angeles, Calif.

[21] Appl. No.: 655,684

[22] Filed: Feb. 14, 1991

Related U.S. Application Data

[62] Division of Ser. No. 489,867, Mar. 5, 1990, Pat. No. 5,029,182.

[51] Int. Cl.$^5$ .............................. H04L 27/08
[52] U.S. Cl. ..................... 375/98; 455/234.1; 329/350; 330/254
[58] Field of Search ............ 375/98; 455/234, 240, 455/237, 234.1, 239.1, 240.1, 232.1, 232.4; 329/350; 330/254

[56] References Cited

U.S. PATENT DOCUMENTS

| | | | |
|---|---|---|---|
| 3,800,228 | 3/1974 | Acker | 375/24 X |
| 4,625,240 | 11/1986 | Yablonski et al. | 375/98 X |
| 5,029,182 | 7/1991 | Cai et al. | 375/1 OR |

OTHER PUBLICATIONS

"Digital Communications Fundamental and Application", Prentice Hall, New Jersey, 1988, pp. 601–602.

Primary Examiner—Curtis Kuntz
Assistant Examiner—Tesfaldet Bocure
Attorney, Agent, or Firm—Wanda K. Denson-Low

[57] ABSTRACT

The invention is an automatic gain control (AGC) sampling structure in which a conventional closed loop AGC circuit detects a received level and generates a direct current voltage for controlling an amplification stage. This direct current voltage is sampled and the optimum control voltage is selected from the samples based on the technique of ordered statistics. The conventional AGC control loop is interrupted and the selected control voltage is provided to the amplification stage.

1 Claim, 4 Drawing Sheets 5,267,272

RECEIVER AUTOMATIC GAIN CONTROL (AGC)

This invention was made with Government support under Contract No. DAAB07-82-G-J220 awarded by the Department of the Army. The Government has certain rights in this invention.

This is a division of application Ser. No. 07/489,867 filed Mar. 5, 1990 now U.S. Pat. No. 5,029,182.

BACKGROUND OF THE INVENTION

1. Field of the Invention

This invention relates in general to high frequency spread spectrum receivers and, in particular, to spread spectrum receivers of the frequency-hopping type. The invention relates especially to a technique and apparatus for automatic gain control (AGC) in a frequency hopping receiver.

2. Description of Prior Art

Frequency hopping is a commonly used technique to provide a secured communication system. Frequency hopping involves the changing of the radio carrier or center frequencies periodically to avoid detection or jamming. In systems employing very fast frequency hopping, the signal is transmitted at each frequency for a very short period such as 20 milliseconds.

For frequency hopping voice communication, the received signal strength must be estimated so that the AGC level can be set. The conventional AGC selection approach, which computes the average sampled energy of the hopping signal, is often used for voice radio. This approach works well in steady benign (non fading) environments with no interference. However, in a severe fading channel, and with the presence of interference over a portion of the hopping bandwidth, the averaging method is vulnerable to error due to the significant contribution of the interference signal to the sample average. The conventional method has also proven to be inefficient in severe slow fading channels such as the Rayleigh fading channel at high frequency (HF).

One approach is to use circuitry having very fast attack and release times in the AGC control circuit to enable the AGC circuitry to respond to each frequency hop. However, the analog circuitry providing sufficiently "fast" attack and release times is complex and expensive. Accordingly there is a need for improved AGC control in frequency hopping receivers to provide improved gain control in the presence of interference or fading.

SUMMARY OF THE INVENTION

It is therefore a primary object of the present invention to provide effective AGC control when receiving frequency hopped analog voice or voice-bandwidth data transmissions in a standard HF receiver.

Another object is to provide a technique for generating an accurate estimate of the optimum AGC level based on a limited sample of known transmitted signals, even in the presence of severe interference and or HF channel fading.

Another object is to provide an AGC technique and apparatus for frequency hopping receivers that does not require complex analog AGC circuitry to respond to each frequency hop using "fast" attack and release times.

Still another object is to provide an improved AGC technique and apparatus that is applicable to a large class of HF receivers.

Briefly, the present invention is an AGC technique and apparatus for setting radio frequency receiver gain when receiving frequency-hopped signals. The invention includes the design of an AGC sampling structure for use with a broad class of frequency-hopped HF waveforms containing known transmitted signals embedded within communications traffic. The sampling structure is a digital structure and an AGC selection technique (algorithm) used in conjunction with a standard closed loop analog AGC circuit in which the AGC generator detects the received audio level and generates a direct current control voltage. In the present invention, this AGC control voltage is sampled during the reception of known transmitted signals to provide a series of independent AGC samples to a digital controller. The digital controller determines the optimum AGC control voltage based a selection algorithm which uses the technique of ordered statistics to select the correct ordered sample to provide the optimum AGC control level for the receiver. The standard AGC control loop is then interrupted and the optimum AGC voltage selected by the digital controller is coupled to provide the direct current control voltage.

The present invention precludes the capture of the AGC by an interference signal unless a majority of the available frequency hopping channels is jammed and the technique is also robust in the Rayleigh fading HF channel environment. Adequate performance with typical receivers can be achieved for attack and release times 3 to 10 time longer than the frequency hop period, thus precluding the need to design complex analog AGC circuitry to respond to each frequency hop. The technique can be applied not only for frequency hopping signals, but also for non-hopping signals being interfered by impulse interference such as atmospheric noise. In addition, the technique is extremely simple to implement in modern digital hardware.

Other objects and many of the attendant advantages will be readily appreciated as the present invention becomes better understood by reference to the following detailed description when considered in conjunction with the accompanying drawings wherein:

DESCRIPTION OF THE PREFERRED EMBODIMENT

Figure 1:
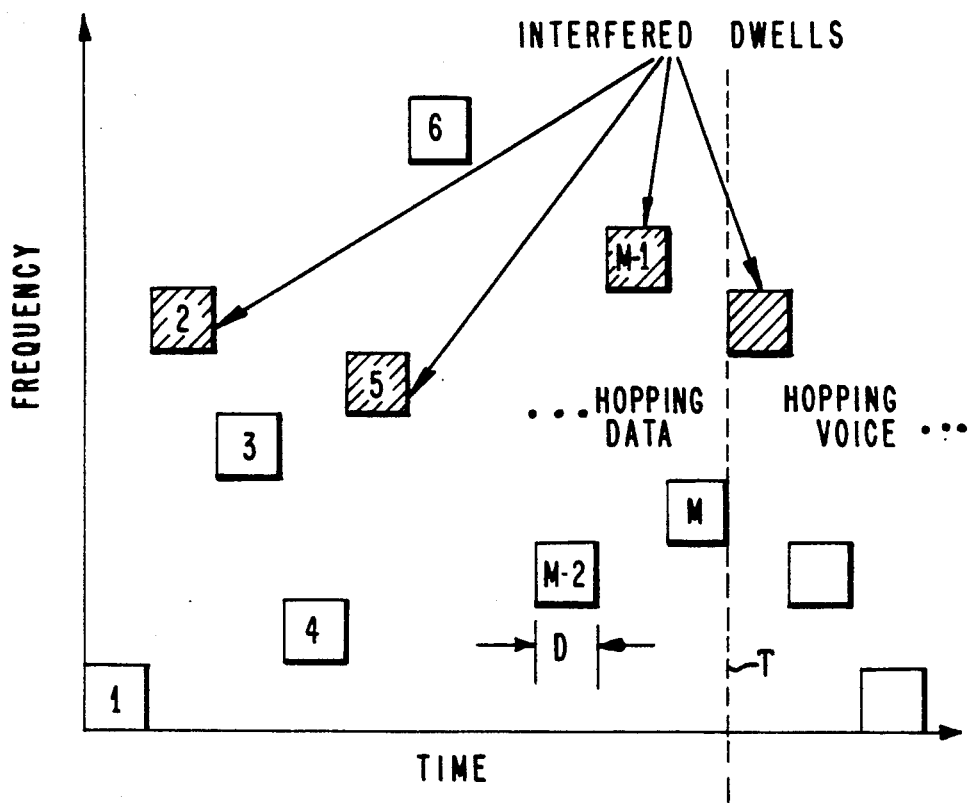
FIG. 1 a plot of signal frequency versus time that illustrates the frequency-hopping characteristic of a frequency hopping communication system.

Referring now to the drawings and, in particular to FIG. 1, the present invention provides improved AGC in a frequency hopping communication system in which a transmitted signal is hopping randomly in a set of independent frequencies $f_1$- $f_M$, as illustrated by blocks 1 - M. A receiver which is designed to operate in this frequency hopping communication system knows these frequencies a priori and thus is able to follow the frequency pattern to "demodulate" the data. For frequency hopping voice communication, the strength of the received signal must be estimated so that the proper AGC level can be set.

To allow the receiver to estimate the strength of the received signal, the transmitter sends a known transmission of duration T on m different frequency hops, with each hop having a dwell time of $D=T/m$. Among m received hops, n samples are taken at the receiver. Typically, this transmission is a series of data pulses of a common amplitude which are transmitted as a preamble to voice communication. Frequency hopping voice transmission is typically initiated within a few hundred microseconds of the end of the preamble at time T.

Figure 2:
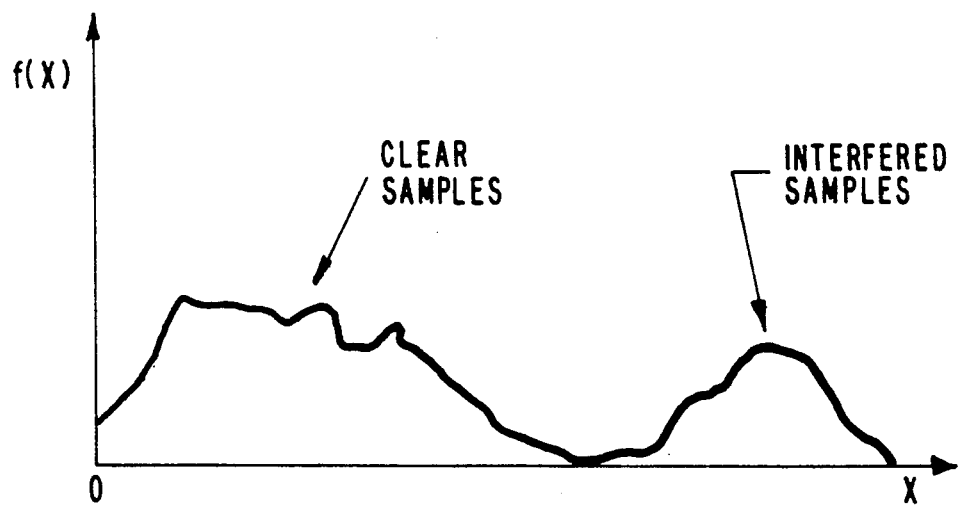
FIG. 2 is a plot of a typical probability density function of frequency hopping signal samples in presence of partial band interference.

Some of these samples may be captured by interference signals, such as interference signals from a partial band jammer, as illustrated by the crosshatched blocks in FIG. 1, but many are not. It is noted that a partial band jammer usually has a small duty factor, so that much energy is concentrated on these interfered frequencies. Thus, on a histogram of the received signal, as shown in FIG. 2, the signal level of the desired signal is associated with the low amplitude portion of the histogram and the interference signal is associated with the high amplitude portion of the histogram. The present invention makes use of the ordered statistics technique to distinguish the interference signal from the clear signal to provide a good estimate of the desired signal.

Because of additive noise, fading characteristics and the interference signal, any estimate of receiver strength (and thus the AGC selection) must have some error. Within the context of this description of the preferred embodiment, it is defined that an AGC selection is acceptable when the calculated AGC setting is within plus or minus 3 dB of the correct value. This value is selected since it defines the level at which a signal change can just be audibly detected. The present invention allows the optimization of the AGC performance by maximizing the probability of acceptable AGC performance. This optimization may be accomplished even in the Rayleigh fading channel in the presence of partial band jamming or impulsive type noise interference.

Figures 3, 5:
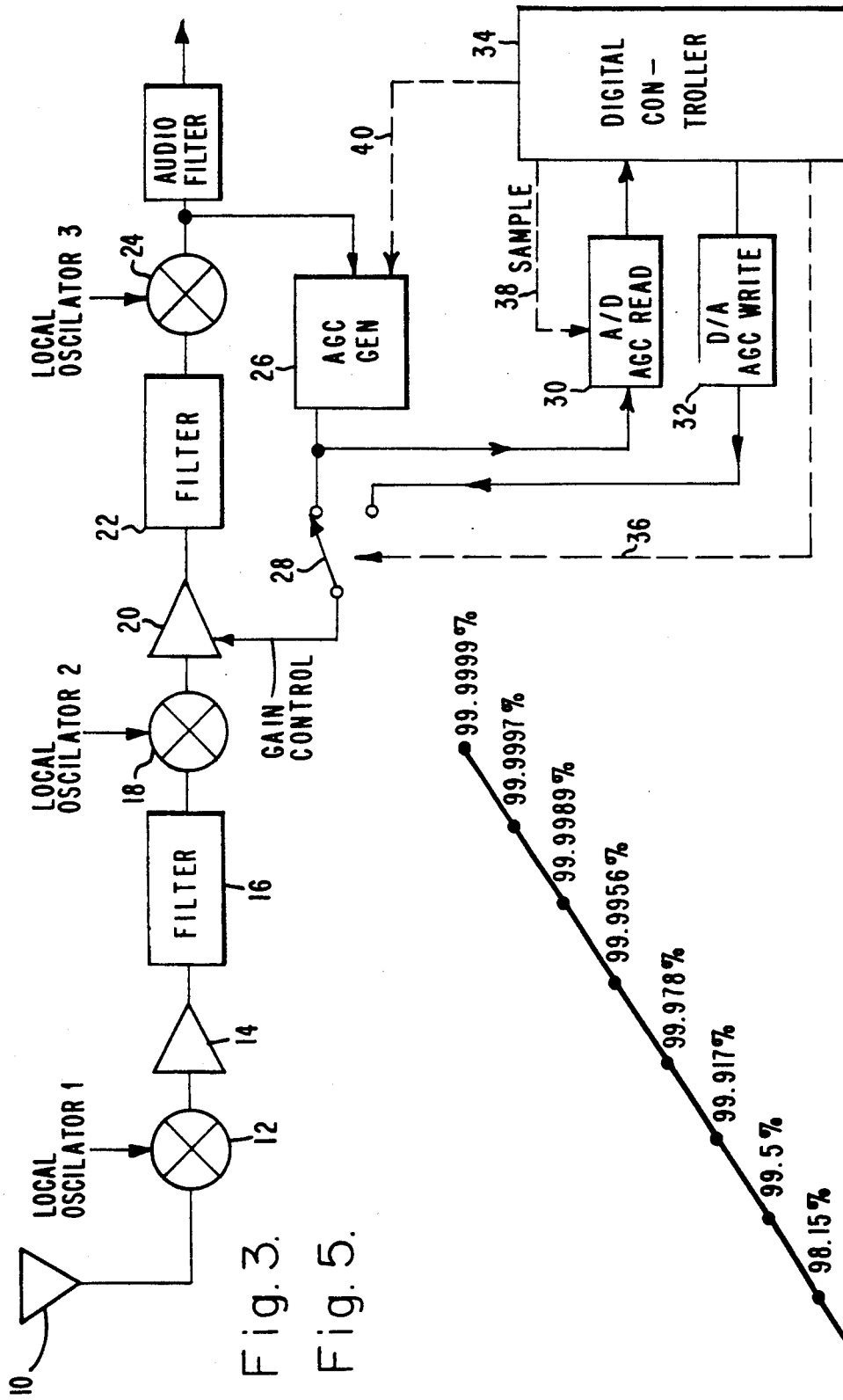
FIG.3 is a block diagram illustrating the automatic gain control technique of the present invention.
FIG. 5 illustrates the optimum selection of sampling order for the AGC control of the present invention for the case of a Rayleigh fading channel with no interference.

FIG. 3. illustrates, in the context of a generalized HF receiver, the digital AGC sampling and control of the present invention added to a standard closed loop analog AGC circuit to provide the AGC apparatus of the present invention. In the generalized HF receiver, the HF signal received through antenna 10 is converted to an intermediate frequency signal prior to the AGC circuitry. As illustrated in FIG. 3, the HF signal may be coupled to mixer 12 where it is mixed with a signal from a first local oscillator to up convert the received signal for amplification and filtering at 14 and 16, respectively. The signal is then mixed with a second local oscillator signal at 18 to down convert the received signal to an intermediate frequency prior to being coupled to the AGC loop.

The typical conventional closed loop AGC circuit includes one or more gain-controlled amplification stages 20 coupled to filter means 22, a further down-conversion stage 24 where the signal is mixed with a signal from a third local oscillator to convert the signal to audio frequency at the loop output. The audio frequency signal is passed through audio filter 25 to provide audio output signal. A portion of the audio frequency signal is coupled to an AGC generator 26 which detects the received audio level, applies the appropriate AGC attack and release time constants for either voice or data reception, and generates a direct current (DC) AGC control voltage which is applied to control the gain of the amplification stages 20. Typically, the AGC generator 26 provides a control voltage that increases with the level of audio signal received. It is noted that AGC may be accomplished at intermediate frequency or even at RF frequency rather than at the audio frequency level, the audio frequency level being used in this description of the preferred embodiment for purposes of illustration only.

Typical time constants for this type of AGC circuit are:
  Voice mode: Attack - 30 milliseconds maximum Release - 0.75 to 1.5 seconds
  Data mode: Attack - 30 milliseconds maximum Release - 60 to 130 milliseconds In the present invention, the conventional AGC loop is modified by the addition of an analog switch 28, an analog-to-digital (A/D) converter 30, a digital-to-analog (D/A) converter 32, and a digital controller 34 as follows. The output of the AGC generator 26 is coupled to the analog switch 28 which is connected to selectively open or close the standard AGC control loop. When the switch 28 is in a first position (as shown in FIG. 3.), the standard AGC control loop is closed and the output of the AGC generator is connected to the gain-controlled amplification stages 20. When the switch 28 is in the second position, the output of the AGC generator is disconnected from the gain-controlled amplification stage 20 and the output of the digital-to-analog (D/A) converter 32 is coupled to the gain-controlled amplifier stage.

The A/D converter 30 is connected to the output of the AGC generator 26 prior to the analog switch 28 in order to sample, or read, the AGC control voltage from the standard AGC control loop. The A/D converter 30 couples the samples of the AGC control voltage to the digital controller 34.

The digital controller 34 is coupled (indicated by dashed line 36) to control the analog switch 28 to select the position of the switch (i.e. to select the source of the AGC control voltage). The Digital controller 34 is also coupled (indicated by dashed line 38) to the A/D converter 30 to control the sample time for the A/D converter and to receive the samples of the AGC generator output and to the AGC generator 26 (indicated by to select the applicable voice mode or data mode attack time and release time. The digital controller 34 computes the optimum AGC control voltage based on the samples of the AGC generator output, and outputs this voltage to the D/A converter 32.

In operation the automatic gain control of the present invention works as follows: During the reception of known transmitted signals of duration T, the digital controller 34 closes the standard AGC loop, allowing it to track the level of the incoming signal exactly as it would in a non-frequency-hopped receiver. Periodically the digital controller 34 then samples (reads) the independent AGC voltage in the A/D converter 30 in such a way that a strong signal on one frequency hop would capture no more than one sample.

Figure 4:
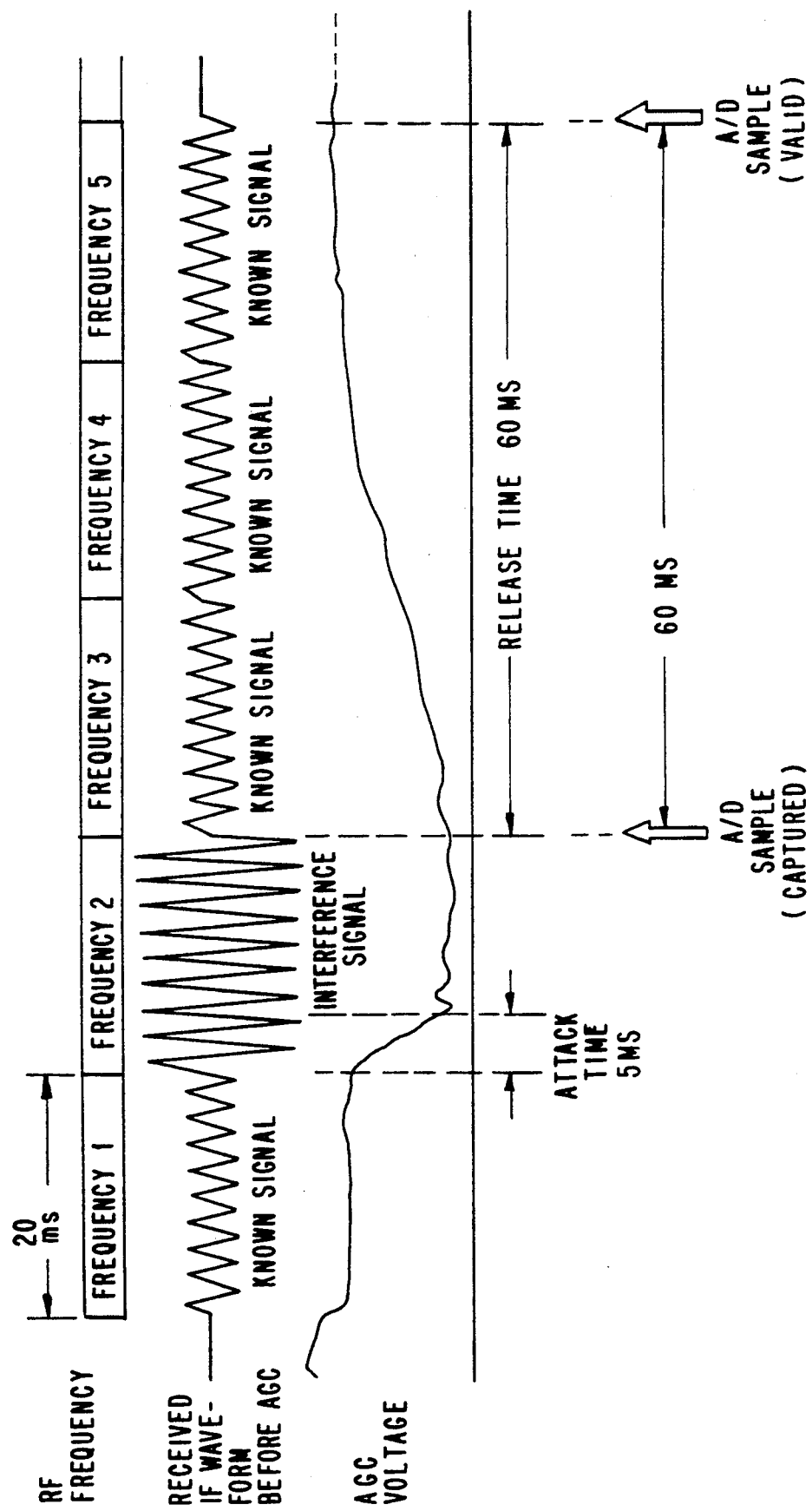
FIG. 4. illustrates waveforms useful in understanding the operation of the present invention.

The sampling process is illustrated in FIGS. 4. One of the primary advantages of this sampling technique is achieved when known signals in a contiguous series of frequency hops are received. Using a series of signals permits the A/D sampling process to occur a a rate slower than the hop rate. FIG. 4 shows an example for a hop rate of 50 hops per second (a 20 ms hop dwell time), and an AGC generator release time of 60 ms. By spacing the A/D samples at a period equal to or greater than the release time, the capture of an AGC sample by a interference signal, as shown, is limited to interference which occurred in the preceding three hop dwells. In the general case, an A/D sample is captured only if the interference occurs in the previous $L=R/D$ hop dwells, where L is the number of hops per sample, R is the release time, and D is hop dwell time. Thus, upon completion of the know transmission of duration T, a total of $n=T/R$ independent samples are recorded.

Following the acquisition of n samples, the digital controller 34 calculates an optimum AGC value in accordance with the statistical method described hereinafter. The result of this calculation is then output to the D/A converter 32, the analog switch 28 is switched to disconnect the AGC generator output from and to connect the output of the D/A converter to the gain controlled amplifier stage 20, thus fixing the AGC voltage at the calculated value.

AGC LEVEL SELECTION ALGORITHM

After the acquisition of the n independent samples the digital controller 34 performs an AGC selection using ordered statistics as follows. The n independent and identically distributed samples $X_1, X_2, X_3, \ldots, X_N$ can be sorted according to amplitude as follows $$X[1]<X[2]<X[3]<\ldots X[12]<X[13]<X[14]<\ldots <X[N]$$

The kth ordered sample, X[k], is selected. The selected sample is then coupled to the D/A converter 32 and the analog switch 28 is switched to connect the output of the D/A converter as the AGC control voltage. Thus it is only necessary to determine which selection of "k" will yield the maximum probability of acceptable AGC. Such selection is called optimum sample order, $k_{opt}$. Without loss of generality, assuming the correct sample S is unity, let f(x) and F(X) be the probability density function and the cumulative distribution function of the AGC samples $X_i$, respectively. The probability of acceptable AGC based on the kth ordered sample is computed via the following equation.

$$P(k) = \int_{\frac{1}{2}}^{2} k \binom{n}{k} F^{k-1}(x)[1 - F(x)]^{n-k} f(x) dx; \quad \text{Equation (1)}$$
$$k = 1, 2, \ldots, n$$

where n is the total number of samples collected, k is the selected order sample for the AGC setting, and the limits of the integration signify the plus and minus 3 dB levels.

The present invention can provide a real-time adaptive AGC control when the digital controller 34 contains a microprocessor that has the processing capability necessary to solve Equation (1) for k equals 1, 2 ... ,n. The solution of Equation (1) determines which of the ordered samples provides the highest probability of acceptable AGC. The value of the sample providing the highest probability of acceptable AGC is then selected for use as the AGC control voltage. Thus the AGC selection can be periodically updated or even updated for each set of samples (i.e., updated each transmission of the known, signals of duration T) depending on the capability of the microprocessor.

It is apparent that the performance of the AGC selection approach depends directly on the statistics of the received signal which depend on the channel fading characteristics and the interference environment. Hence a good AGC selection (via kth ordered sample) for one channel condition may not be good enough for other channel conditions. However, a digital controller 34 that has sufficient processing power to provide adaptive AGC control by computing a real-time solution to Equation (1) requires an extensive processing capability, the expense of which may not be justified in the context of the potential environment for use of the receiver.

In the following paragraphs, a technique of selecting $k_{opt}$ that will maximize P for the expected environment is discussed and for selecting $k_{opt}$ for use in the digital controller 34 when real-time adaptive solution of Equation (1) is not feasible. In this case, the $k_{opt}$ (or several $k_{opt}$ for different environments) for the expected operating environment is computed a priori and stored in the digital controller 34. In operation, the digital controller 34 sorts the samples $X_i$ and selects the proper sample based on the stored $k_{opt}$. The selected sample is then coupled to the D/A converter 32 for transmission to amplifier 20 as the AGC control voltage.

Turning now to the selection of $k_{opt}$ that will maximize P, consider first a nonfading channel with no interference. If noise is absent, all statistics are the same since the signal is deterministic. Thus any ordered statistics yields the ideal AGC selection, and the probability of acceptable AGC is 100%.

In the case of a Rayleigh fading channel with no interference, the received sample has the following probability density function:

$$f(x)=\exp(-x), \quad \text{equation (2)}$$

where $x \geq 0$ and $S=1$ (assumes that the mean energy is unity)

From Equation (1), the probability of acceptable AGC, P(k), can be computed and the optimum selection of $k_{opt}$ can be found. The selection of optimum sample ordered is shown by line 42 in FIG. 5 as a function of the number of samples. It is observed that the optimum selection for this case is about ¾ of the total number of samples. The probability of maximum acceptable AGC is also noted. It is seen that as the number of AGC samples n increases, the probability of acceptable AGC increases. Hence having a required level of probability of acceptable AGC, the minimum required number of AGC samples and the optimum sampling order are determined.

In the case of a fading channel with an interference signal, the ordered statistics depends not only on the fading statistics but also on the characteristics of the interference signal, which include the interference to signal power (I/S) ratio and the interference bandwidth factor 100 ($\phi$=interference bandwidth/ total hopping bandwidth) of the interferer. In general the channel can often be assumed as a Rayleigh fading or Rician fading channel. If the I/S ratio and the interference bandwidth factor $\phi$ of the interferer can be accurately predicted, the probability of acceptable AGC, P(k), in equation (1) can be plotted as a function of k. The procedure to computer P(k)) is as follows:

o Compute the probability that a sample is captured by an interference signal is as follows:

$$\alpha = \sum_{i=1}^{L} \binom{L}{i} \phi^i (1-\phi)^{L-i} \quad \text{Equation (3)}$$

where L is the total number of hop dwells per sample.

o Compute the probability density function of the recorded samples $$f(x) = (1-\alpha)p_{NI}(x) + \alpha p_I(x) \quad \text{equation (4)}$$

where $p_{NI}(s)$, and $p_I(s)$ are the probability density functions of the sample when it is captured and not captured by the interference, respectively, based on the known statistics of the channel and the interference signal. As an example, assuming the channel is selective Rayleigh fading and the interference source is a number of line of sight transmitted signals, the density functions, $p_{NI}(s)$, and $p_I(s)$, are computed via the following formulas, $$p_{NI}(x) = \exp(-x); x \geq 0, S = 1 \quad \text{Equation (5)}$$

$$p_I(x) = \exp\left[-\left(\frac{I_h}{S}+x\right)\right] I_0\left(2\sqrt{\frac{I_h}{S}x}\right), \text{Equation (6)}$$
$$x \geq 0; S = 1$$

$$\frac{I_h}{S} = \frac{I}{S} \times \frac{1}{\phi \times N} \quad \text{Equation (7)}$$

where $I_0(x)$ is the first order Bessel function, and N is the total number of frequencies.

o Compute the probability of acceptable AGC, P(k), via Equation (1), o Select k such that P(k) is maximum. The ordered sample X[k] is the optimum selection for the AGC setting.

It is noted that the interference bandwidth factor $\phi$ may not be accurately predicted, and a receiver can be operated anywhere within $\phi_{min} \leq \phi \leq \phi_{max}$. The optimum sampling order "$k_{opt}$" can be found by a minimax technique as follows:

o Plot the curve P(k) as a function of k for $\phi$ for different values $\phi_1 = \phi_{min}, \phi_2, \phi_3, \ldots, \phi_n, = \phi_{max}$, representing different ranges of uncertainty.

o Determine $P_{max} = Max_k\{Min_{\phi_i}P(k)\}$ and the corresponding "$k_{opt}$" for the uncertainty range from the above results.

ILLUSTRATIVE NUMERICAL EXAMPLES

The AGC selection algorithm is most easily illustrated by the following example:

- Release time = 60 ms
- Hop rate = 50 h/s
- Number of samples = 30
- AGC transmission time = 1.8 sec
- Channel: Rayleigh Fading
- Line of Sight interference sources
- Interference to Signal power ratio = I/S = 20 dB
- Interference bandwidth factor: $0 \leq \phi \leq \phi_{max} = 12\%$
- Total number of hopping frequencies = 200

Figure 6:
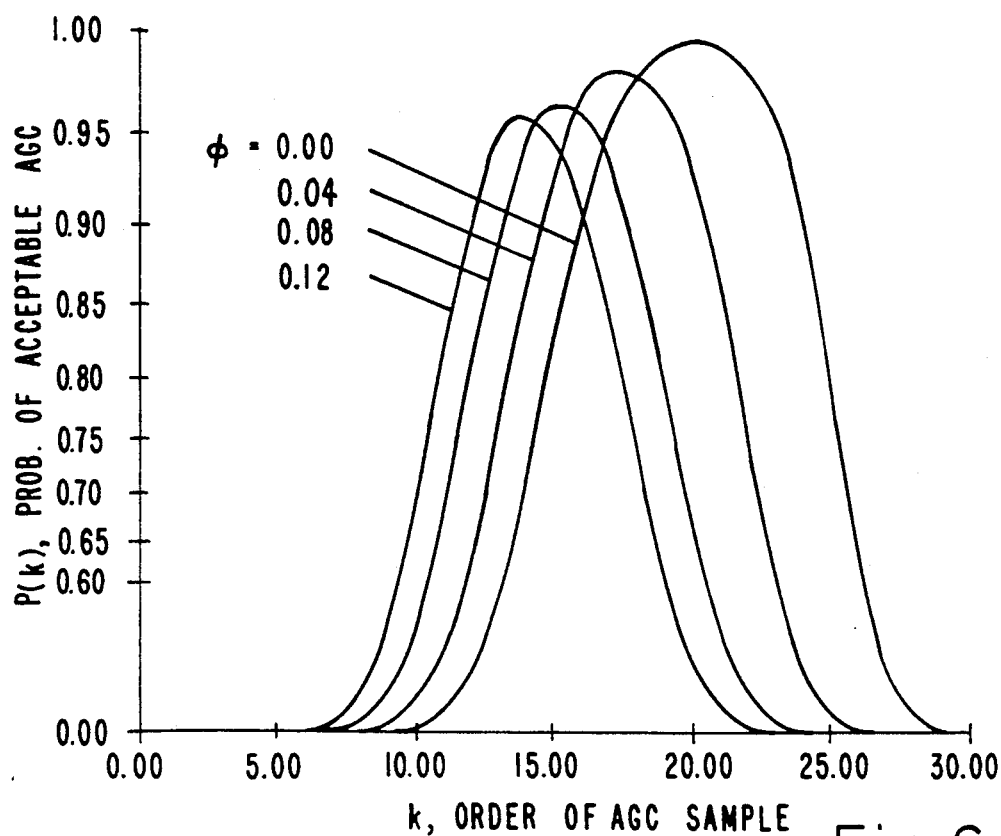
FIG. 6 is a plot of the probability of acceptable AGC in the presence of partial band interference versus the order of AGC sample for various values of the interference bandwidth factor $\phi$.

The probability of acceptable AGC, P(k) is computed and is plotted in FIG. 6 for different values of $\phi$. Clearly, the selection of optimum "$k_{opt}$" depends on the interference duty factor $\phi$. The selection is summarized in the following table:

TABLE 1

| Optimum selection of ordered statistic | | |
|---|---|---|
| | $K_{opt}$ | $P_{max}$ |
| $\phi = 0.00$ | 20 | .995 |
| $0.00 \leq \phi \leq 0.04$ | 18 | .980 |
| $0.00 \leq \phi \leq 0.08$ | 17 | .940 |
| $0.00 \leq \phi \leq 0.12$ | 16 | .910 |
| $0.04 \leq \phi \leq 0.08$ | 16 | .970 |
| $0.04 \leq \phi \leq 0.12$ | 15 | .930 |
| $0.08 \leq \phi \leq 0.04$ | 15 | .950 |

These results show that even in the severe interference environment, the newly devised AGC approach for AGC circuit works very well. Nevertheless, if the AGC circuit can be improved to have shorter attack and release times, the performance is then vastly improved. The following example is the typical illustration of the AGC approach using faster release time AGC circuits.

- Release time = 20 ms
- Hop rate = 50 h/s
- Number of samples = 90
- AGC transmission time = 1.8 sec
- Channel: Rayleigh Fading
- Line of Sight interference sources
- Interference to Signal power ratio = I/S = 20 dB
- Interference bandwidth factor: $0 \leq \phi \leq \phi_{max} = 12\%$
- Total number of hopping frequencies = 200

Figure 7:
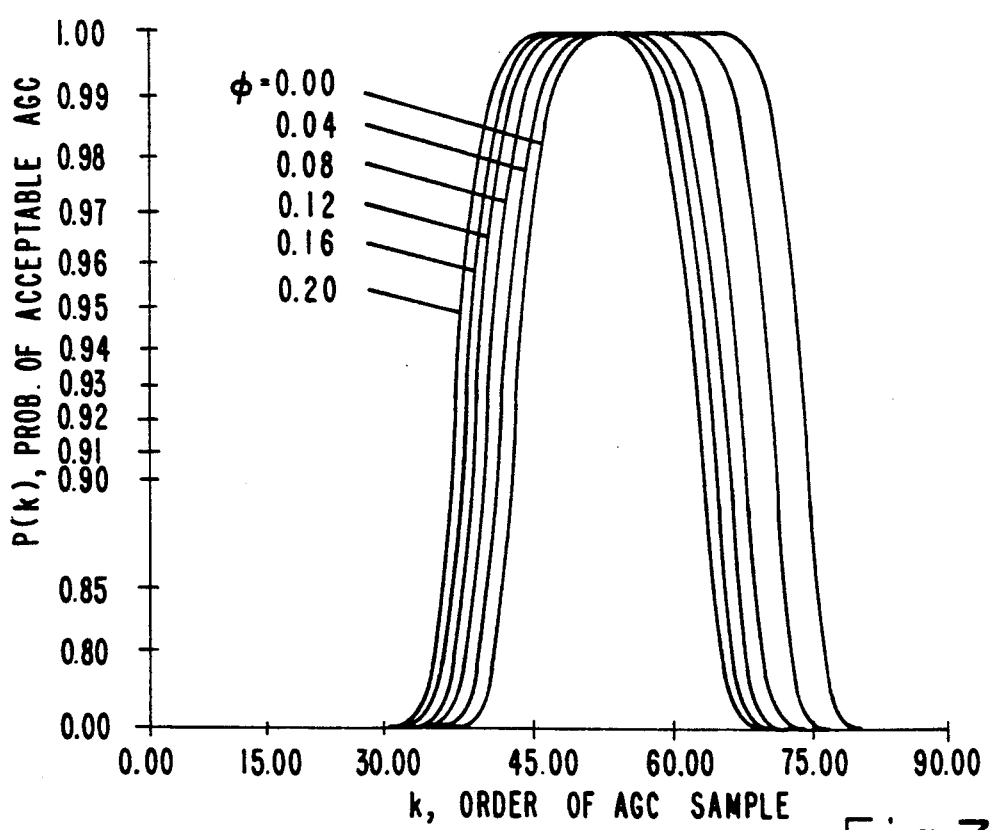
FIG. 7 is a plot of acceptable AGC in the presence of partial band interference for fast release AGC circuits.

The probability of acceptable AGC P(k) is computed and is plotted in FIG. 7 for different values of $\phi$. The results show that, with a good selection of ordered sample, the performance is superior compared to the slow release time AGC circuit.

Obviously, many modifications and variations of the present invention are possible in light of the above teachings. It is therefore to be understood that within the scope of the appended claims, the invention may be practiced otherwise than as described.

What is claimed is:

1. In a receiver of the type wherein automatic gain control is provided by a closed loop including a gain-controlled amplification stage for adjusting the gain of a received signal, the gain of said gain-controlled amplification stage being controlled by a gain-control signal and an AGC generator for providing a gain-control signal to a gain-controlled amplification stage for controlling the gain based on the strength of the received signal, said AGC generator being coupled to the output signal of the gain-controlled amplification stage for sensing the strength of the output signal, the improvement comprising:

(a) means for sampling the gain-control signal from said AGC generator to provide samples;

(b) means for selecting the optimum gain-control signal from said samples based on the probability of acceptable AGC, P (k), according the following formula:

$$P(k) = \int_{\frac{1}{2}}^{2} k \binom{n}{k} F^{k-1}(x)[1 - F(x)]^{n-k} f(x)dx; \ k = 1,2\ldots,n$$

where n is the total number of samples collected, k is the selected order sample for the AGC setting, and F(x) and F(X) are the probability density function and the cumulative distribution function of the samples $X_i$, respectively, the optimum gain-control signal being the sample having the highest probability of acceptable AGC; and (c) means for coupling said optimum gain control signal from said controller means to control the gain of said gain-controlled amplification stage.

* * * * *